US008563998B2

(12) United States Patent
Wegleiter et al.

(10) Patent No.: US 8,563,998 B2
(45) Date of Patent: Oct. 22, 2013

(54) OPTOELECTRONIC SEMICONDUCTOR COMPONENT AND METHOD OF PRODUCING AN OPTOELECTRONIC SEMICONDUCTOR COMPONENT

(75) Inventors: Walter Wegleiter, Nittendorf (DE); Ralph Wirth, Mintraching-Auhof (DE); Bernd Barchmann, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 156 days.

(21) Appl. No.: 12/934,327

(22) PCT Filed: Mar. 26, 2009

(86) PCT No.: PCT/DE2009/000417
§ 371 (c)(1),
(2), (4) Date: Oct. 7, 2010

(87) PCT Pub. No.: WO2009/121339
PCT Pub. Date: Oct. 8, 2009

(65) Prior Publication Data
US 2011/0024790 A1    Feb. 3, 2011

(30) Foreign Application Priority Data

Mar. 31, 2008 (DE) .......................... 10 2008 016 487

(51) Int. Cl.
*H01L 33/00* (2010.01)
(52) U.S. Cl.
USPC ............. 257/98; 257/678; 257/738; 257/778; 257/E21.504; 257/E33.059; 438/26; 438/29

(58) Field of Classification Search
USPC .................... 257/678, 738, 778, E33.059, 98, 257/E21.504; 438/26, 29
See application file for complete search history.

(56) References Cited

U.S. PATENT DOCUMENTS

| | | | |
|---|---|---|---|
| 5,500,280 A * | 3/1996 | Yamazaki et al. ............ 428/220 |
| 6,722,030 B1 | 4/2004 | Stelzl et al. | |
| 7,388,281 B2 | 6/2008 | Krueger et al. | |
| 7,673,386 B2 | 3/2010 | Stelzl et al. | |
| 7,791,186 B2 * | 9/2010 | Kikuchi et al. ............... 257/698 |
| 8,026,115 B2 * | 9/2011 | Barnes et al. ................... 438/26 |
| 2004/0158977 A1 | 8/2004 | Murata | |

(Continued)

FOREIGN PATENT DOCUMENTS

| | | |
|---|---|---|
| CN | 1596040 A | 3/2005 |
| DE | 198 06 818 C1 | 11/1999 |

(Continued)

OTHER PUBLICATIONS

English translation of WO 2006/034671.*

(Continued)

*Primary Examiner* — John C Ingham
(74) *Attorney, Agent, or Firm* — DLA Piper LLP (US)

(57) ABSTRACT

An optoelectronic semiconductor component includes a connection support with a connection side, at least one optoelectronic semiconductor chip mounted on the connection side and electrically connected to the connection support, an adhesion-promoting intermediate film applied to the connection side and covering the latter at least in selected places, and at least one radiation-transmissive cast body which at least partially surrounds the semiconductor chip, the cast body being connected mechanically to the connection support by the intermediate film.

13 Claims, 4 Drawing Sheets

(56) References Cited

U.S. PATENT DOCUMENTS

2005/0224829 A1  10/2005  Negley
2006/0186428 A1  8/2006   Tan et al.
2007/0215998 A1  9/2007   Hu et al.
2008/0048200 A1* 2/2008   Mueller et al. .................. 257/98

FOREIGN PATENT DOCUMENTS

| | | |
|---|---|---|
| DE | 102 38 523 A1 | 3/2004 |
| DE | 103 39 985 A1 | 3/2005 |
| DE | 10 2006 025 162 B3 | 1/2008 |
| EP | 0 611 129 A2 | 8/1994 |
| EP | 1 684 363 A2 | 7/2006 |
| TW | 200537714 | 11/2005 |
| WO | 2005/081319 A1 | 9/2005 |
| WO | 2005/104229 A1 | 11/2005 |
| WO | 2006/034671 A2 | 4/2006 |
| WO | 2008/018336 A10 | 2/2008 |

OTHER PUBLICATIONS

English translation of DE 103 39 985.*

* cited by examiner

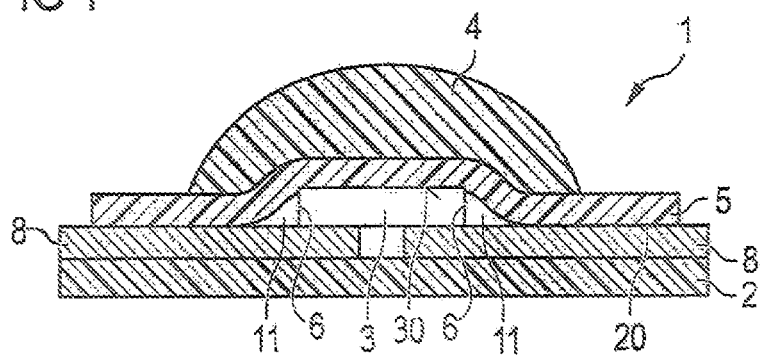
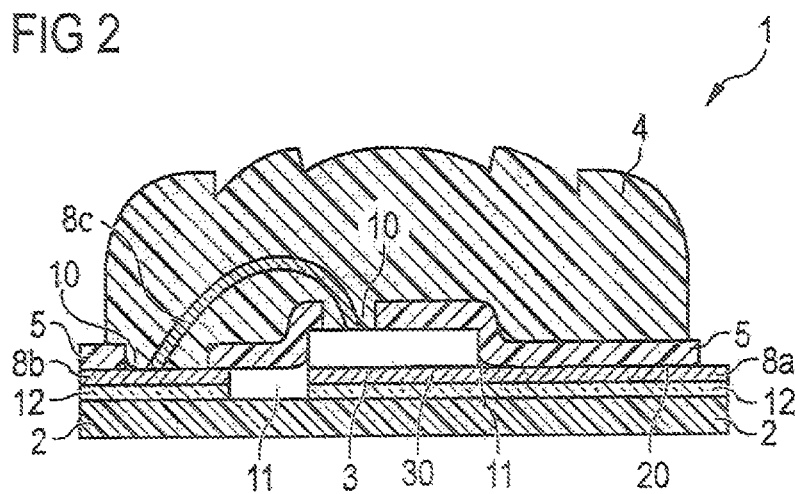

OPTOELECTRONIC SEMICONDUCTOR COMPONENT AND METHOD OF PRODUCING AN OPTOELECTRONIC SEMICONDUCTOR COMPONENT

RELATED APPLICATIONS

This is a §371 of International Application No. PCT/DE2009/000417, with an international filing date of Mar. 26, 2009 (WO 2009/121339 A1, published Oct. 8, 2009), which is based on German Patent Application No. 10 2008 016 487.9, filed Mar. 31, 2008, the subject matter of which is incorporated by reference.

TECHNICAL FIELD

This disclosure relates to an optoelectronic semiconductor component and a method of producing such an optoelectronic semiconductor component.

BACKGROUND

Widespread industrial use is made of optoelectronic components such as for instance light-emitting diodes or photodiodes. Examples of the features which encouraged the widespread use of such components are their high efficiency and resistance to external stresses and environmental influences. For example, optoelectronic components may for instance resist moisture or heat well and are also resistant to mechanical stresses if suitably designed. In addition to being highly efficient, optoelectronic components also have a long service life, are compact and may be configured in many different ways as well as being capable of production with comparatively low manufacturing costs. A crucial factor for many of the above-stated characteristics is often the housing of the optoelectronic component, by which particular care is therefore generally set.

It could therefore be helpful to provide an optoelectronic component which is resistant to ageing and a method of producing such an optoelectronic component.

SUMMARY

We provide an optoelectronic semiconductor component including a connection support with a connection side, at least one optoelectronic semiconductor chip mounted on the connection side and electrically connected to the connection support, an adhesion-promoting intermediate film applied to the connection side and covering the latter at least in selected places, and at least one radiation-transmissive cast body which at least partially surrounds the semiconductor chip, the cast body being connected mechanically to the connection support by the intermediate film.

We also provide a method of producing the optoelectronic semiconductor component including providing a connection support with a connection side, providing at least one semiconductor chip, mounting the semiconductor chip on the connection side, applying an intermediate film to the connection side, and producing a cast body.

BRIEF DESCRIPTION OF THE DRAWINGS

A component described here and a method described here will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1 is a schematic sectional representation of one example.

FIG. 2 is a schematic sectional representation of a further example.

DETAILED DESCRIPTION

Figure 3:
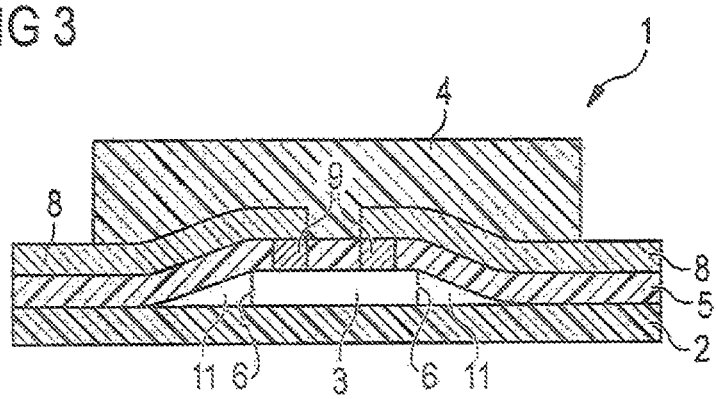
FIG. 3 is a schematic sectional representation of an example with a Fresnel lens.

The optoelectronic semiconductor component may comprise a connection support with a connection side. The connection support may take the form of a circuit board, for instance, which comprises etched, printed or vapor-deposited conductive tracks. The connection support may be of mechanically flexible construction, for example, it may take the form of a flexible, particularly polyimide-based printed circuit board or indeed comprises mechanically rigid materials such as, for instance, ceramics or glasses. Preferably, the connection support displays high thermal conductivity such that it is suitable for effective dissipation to the outside of any electrical power loss arising when the optoelectronic semiconductor component is in operation, which primarily results in the generation of heat.

Depending on requirements, it may be advantageous for the connection support to be transmissive in a particular spectral range of the electromagnetic spectrum. The geometric dimensions of the connection support may also be adapted to the respective requirements of a specific application. The connection side of the connection support may be of, for instance, flat or planar construction and be suitable for accommodating at least one optoelectronic semiconductor chip. Normally, the connection support comprises one connection side, but it is not impossible for both sides of a tabular connection support, for example, to be used as connection sides.

The latter may comprise at least one optoelectronic semiconductor chip. The semiconductor chip is configured either to receive or emit electromagnetic radiation when in operation. The semiconductor chip may take the form of a photodiode and thus of a sensor, or of a light-emitting element, for instance in the form of a light-emitting diode or laser diode. The semiconductor chip may be tabular in form and, for example, comprise a square or rectangular base area. It is likewise possible for the semiconductor chip to comprise hexagonal or round base areas, for instance, which allow a high-density arrangement of the semiconductor chips on a connection support, for example. There are no strict limits to the thickness of the semiconductor chip, with the thickness preferably amounting, however, to less than 200 µm, in particular, less than 50 µm. The semiconductor chip may, for example, take the form of a thin film chip, as described in WO 2005/081319 A1, the disclosure of which regarding the semiconductor chip described therein and the production method described therein is hereby incorporated by reference.

The electrical contacts of the semiconductor chip may all be located on the top or bottom of the chip, in each case on the flanks of the semiconductor chip or indeed on both the top and bottom of the chip. In addition, the semiconductor chip comprises a radiation passage face through which the light to be emitted or received by the semiconductor chip leaves the semiconductor chip or enters it through this face. The radiation passage face may be of planar construction or comprise structuring which makes it easier for the incident or emergent light to pass through the radiation passage face.

The latter may comprise an adhesion-promoting intermediate film, also denoted as intermediate foil. This intermediate film is applied to the connection side of the connection support and covers it at least in places. The intermediate film may be formed homogeneously from a single material or indeed have a multilayer structure. In particular, it is possible for the adhesion-promoting intermediate film to comprise structuring, for example, in the form of openings or for electrically conductive structures to be applied to this intermediate film. The thickness of the intermediate film is preferably in the range from 20 μm to 200 μm, in particular between 35 μm and 60 μm.

The latter may comprise at least one radiation-transmissive cast body. Radiation-transmissive means that the cast body should be regarded substantially as transparent or translucent in the electromagnetic spectral range relevant to operation of the semiconductor chip. This means that the cast body absorbs less than 20%, preferably less than 10%, particularly preferably less than 5% of the radiation in the relevant spectral range.

The cast body may extend only over or on a single major side of the connection support. It is likewise preferable for end faces of the connection support to be free of the cast body and/or the intermediate film. In other words, the cast body does not surround the connection support on several sides.

The latter may comprise a connection support with one connection side and at least one optoelectronic semiconductor chip which is mounted on the connection side and is electrically connected to the connection support. The connection side may comprise at least one landing, also denoted as connection area, which is designed to be connected to the electrical contacts of the semiconductor chip. The landing may, for example, take the form of a solder or adhesion pad. Furthermore, the semiconductor component comprises an adhesion-promoting intermediate film, which is applied to the connection side and at least partially covers it. In addition, the semiconductor component comprises at least one radiation-transmissive cast body, which at least partially surrounds the semiconductor chip, the cast body being connected mechanically to the connection support by the intermediate film.

The adhesion-promoting intermediate film is accordingly such that it adheres to the connection support or to the connection side thereof. In addition, the intermediate film is intended to be adhesively bonded to the cast body. For example, it is possible for the adhesive bond between intermediate film and connection support to be better than the adhesive bond between cast body and connection support. In addition, it is then possible for the adhesive bond between cast body and intermediate film to be improved over the adhesive bond between cast body and connection support. The adhesive bond between cast body and connection support is improved by at least a factor of 1.5 as a result of using the intermediate film, particularly preferably by at least a factor of 2.

Such an intermediate film ensures a durable, mechanically stable bond between connection support and cast body. It is not necessary for the entire side of the cast body facing the connection support to be in direct contact with the intermediate film. In particular, there may for instance be electrical connections between the cast body and the intermediate film.

The mechanical connection between the cast body and the connection support may also be effected indirectly, at least in places, such that, for example, the cast body adheres to the intermediate film, and the latter in turn to a semiconductor chip, the semiconductor chip being connected directly to the connection support. It is likewise possible for the semiconductor chip, via which the connection is provided between intermediate film and connection support, to be connected indirectly to the connection support, for example, via a rewiring plane, a heat sink or, for example, a ceramic intermediate support. The cast body surrounds the semiconductor chip, for instance, at the radiation passage face thereof and the chip flanks. Chip flanks should here be understood to mean those side faces of the semiconductor chip which are, for example, oriented transversely of the connection side or of a landing and connect the radiation passage face to the face of the semiconductor chip facing the connection side.

An optoelectronic semiconductor component configured in this way is resistant to ageing and comprises good optical properties.

The radiation passage face of the semiconductor chip may be covered by the intermediate film at least in places. In particular, the entire radiation passage face may be covered by the intermediate film. The intermediate film is here preferably transmissive for the electromagnetic radiation to be received or emitted by the semiconductor chip, at least in a sub-range of the relevant spectral range. In particular, the intermediate film may be transparent in the relevant spectral range. Through such an arrangement or configuration of the intermediate film, the optoelectronic semiconductor component may be straightforwardly produced.

The intermediate film may comprise a silicone film. This means that the intermediate film includes a silicone film or consists entirely of a silicone film. Intermediate film and cast body preferably consist of the same material or of materials which allow a good adhesive bond between the two. Since silicone displays good resistance to electromagnetic radiation, particularly in the blue and near ultraviolet spectral ranges, such an intermediate film allows the obtainment of an optoelectronic component resistant to ageing.

The intermediate film may comprise a material, or consists of such a material, which does not transmit radiation. In other words, the intermediate film is neither transparent nor translucent. Preferably, the intermediate film then comprises at least one opening or at least one orifice at the radiation passage face, such that the radiation passage face is free of the intermediate film at least in places.

A cavity may be formed between intermediate film, connection side and chip flanks. In other words, the intermediate film then spans the semiconductor chip in the manner of a tent. The chip flanks may here remain wholly uncovered by the intermediate film or indeed a large proportion of the chip flanks may be covered thereby. If, for instance, electrical conductive tracks need to be applied to the intermediate film in a subsequent, for example, lithographic or vapor deposition step, it is advantageous for the cavity formed to be of a relatively large volume such that the gradient of the intermediate film parallel to the orientation of the connection side is not too great. This prevents too little material, for instance, from being deposited in excessively steeply oriented parts of the intermediate film in a vapor deposition process in these excessively steep zones. Photolithographic structuring is also only possible in zones in which the intermediate film is not oriented too steeply relative to the connection side. "Not too steeply" means that the angle between the plane defined by the radiation passage face of the semiconductor chip and the surface of the intermediate film remote from the connection side is smaller than 45°, preferably smaller than 30°. If the radiation passage face comprises structuring, the plane is defined in that the radiation passage face is averaged spatially over the radiation passage face structuring, in a direction perpendicular to the main plane of extension of the intermediate film.

The cast body may comprise silicone. Silicone is particularly resistant to ageing with regard to electromagnetic radiation in the blue or UV spectral ranges. The cast body is preferably of one-piece construction. It is likewise possible for the cast body to comprise, for instance, a plurality of layers or shell-like structures which may also be molded from different materials.

Alternatively, the cast body may also be made from, for instance, an epoxy resin or an epoxy resin/silicone hybrid material. Critical to selection of the material of the cast body is that the selected material is resistant to ageing in relation to the radiation to be emitted or received by the semiconductor chip and is at least partially transparent in the spectral range relevant to operation of the semiconductor chip. In addition, the material of the cast body preferably needs to be able to withstand the temperatures arising during operation of the optoelectronic semiconductor component.

The cast body and/or the intermediate film may contain at least one admixture in the form of a diffuser, conversion or filter agent. The cast body and/or intermediate film may, in particular, each contain a plurality of admixtures, wherein the cast body and intermediate film may also contain different levels of admixtures. If the semiconductor chip is constructed for instance as a photodiode, the cast body may, for example, also contain a plurality of filter agents which only allow light in a certain spectral range through to the semiconductor chip. With a suitable conversion agent as admixture, a blue-emitting light-emitting diode may, for example, be used to enable use of a semiconductor component as a white light source. With diffuser agents such as, for instance, $TiO_2$ particles, for example, in the intermediate film, it is possible to achieve a lighting device emitting homogeneously over the entire radiating area thereof.

The connection support may comprise a metal or a metal alloy, a plastics material or a ceramic material. The connection support may consist of a single material, for example, of copper or also of a multilayer system which, for example, displays particularly good thermal conductivity. Depending on the selection of suitable ceramics, the connection support may be, for instance, transparent or reflective in the relevant spectral range.

The latter may have no housing apart from the connection support, the intermediate film and the cast body. The intermediate film and/or the cast body may comprise admixtures. Such a semiconductor component may be particularly compact, comprises a small number of components and is therefore also inexpensive.

The radiation passage face of the semiconductor chip may be remote from the connection support. In addition, the cast body may cover the entire semiconductor chip in a direction perpendicular to the radiation passage face.

The cast body may be formed as an optical element. For example, the cast body forms a lens.

A further cavity may be enclosed by the intermediate film, the connection support and the electrical conductors. Alternatively, the further cavity is enclosed by the semiconductor chip, the connection support and the electrical conductors, the further cavity then thus having preferably no contact with the intermediate film. An insulator, located, for example, between the connection support and the electrical conductors, may also adjoin the further cavity. The further cavity is, for example, filled with a gas or evacuated. However, the further cavity is free of a liquid or a solid.

A method of producing such an optoelectronic semiconductor component is additionally provided. For example, the method may be used to produce an optoelectronic semiconductor component as described in relation to one or more of the above-stated examples.

The method comprises at least the following:
providing a connection support with a connection side,
providing at least one semiconductor chip,
mounting the semiconductor chip on the connection side,
applying an intermediate film to the connection side, and
producing a cast body.

The at least one semiconductor chip may also be provided in that the semiconductor chip is grown on a suitable connection support, for example, epitaxially. In this case, the connection side preferably represents a suitable growing surface, for instance in the form of a semiconductor material. The method step of applying the semiconductor chip is in this case included in the step of providing it. The method may take place at least in part in a wafer composite.

Such a method makes it possible efficiently to produce ageing-stable optoelectronic components.

The intermediate film may be applied over the entire surface of the connection side and on the at least one semiconductor chip. The film thus provides a continuous cover over the connection side and the semiconductor chips located thereon. Such application of the intermediate film is simple to carry out and reduces manufacturing costs.

Application of the intermediate film may comprise:
applying a partially crosslinked intermediate film by lamination, and
curing the intermediate film applied by lamination.

The partially crosslinked intermediate film may for instance be a silicone film which is applied in a still soft, ductile or viscous state to the connection side of the connection support. The partially crosslinked intermediate film may hereby be readily conformed both microscopically and macroscopically to the surface structure of the connection support. In a subsequent step, the intermediate film applied by lamination is fully crosslinked or cured. This may also for instance be heat-induced or effected by means of UV radiation. The volume shrinkage of the intermediate film caused by curing preferably amounts to less than 10%, particularly preferably less than 3%. This two-stage application of the intermediate film has the advantage that a particularly good adhesive bond is achieved between the intermediate film and the connection support.

The cast body may be produced by compression molding, the connection support or the connection side thereof forming part of the mold. In compression molding, a cast film is conventionally used onto which the mold is then pressed. The mold is sealed by way of the cast film. Depending on the configuration of the intermediate film, the cast film may be dispensed with since a sufficient seal between mold and connection support may be achieved by way of the intermediate film. In other words, in addition to its property as a bonding agent, the intermediate film may also constitute a cast film for the compression molding method. Compression molding simplifies the production process and reduces production costs.

Recesses may be produced in the intermediate film by laser ablation. For laser ablation, the intermediate film is preferably designed to be absorbent in a spectral range. For example, the intermediate film may be absorbent below approx. 400 nm such that, for example, laser radiation in the UV spectral range is absorbed by the film and the latter may thus be ablated. Preferably, a short pulse laser with pulse durations in the nano second range or indeed in the femto second range is used for laser ablation. Frequency tripled solid-state lasers are particularly suitable. The laser radiation may be focused onto the intermediate film. Depending on requirements, the size of the focus diameter may be adjusted by way of suitable optical systems to give rise automatically to a particular structure size. If the focus diameter amounts, for example, to 20 μm, recesses with diameters of 20 μm may be straightforwardly produced. Alternatively, the intermediate film may also be scanned by the laser radiation such that larger through-patterns may also be produced therein. In addition to short pulse lasers, it is in principle also possible to use focused continuous wave lasers with suitable wavelengths in particular for scanning. By laser ablation, recesses may be produced highly precisely in the intermediate film particularly simply and gently with regard to the structures or layers located under the intermediate film.

Recesses necessary for instance for the electrical contacts of semiconductor chips may likewise be produced in addition to laser ablation alternatively, for instance, by lithographic methods or etching methods. Mechanical methods such as, for example, precision milling are also feasible.

The sequence in which individual method steps are listed does not necessarily have to correspond to the sequence in which the method steps are performed. However, the indicated sequence should be regarded as preferable.

Some of the fields of application in which optoelectronic components described herein could be used are, for instance, the backlighting of displays or display means. Furthermore, the optoelectronic components described herein may, for instance, also be used in lighting devices for projection purposes, in floodlights or spotlights or for general lighting.

Turning now to the drawings, FIG. 1 shows an example of an optoelectronic semiconductor component 1. Electrical conductors 8 are mounted on a planar connection side 20 of a connection support 2, which is made from a ceramic material with high thermal conductivity. An optoelectronic semiconductor chip 3 is mounted on the side of the electrical conductors 8 remote from the connection support 2. The electrical connection between the semiconductor chip 3 and the electrical conductors 8 is brought about, for example, by means of electrically conductive adhesive.

The side of the semiconductor chip 3 remote from the connection support 2 forms a radiation passage face 30 thereof. The chip flanks 6 are formed by the defining faces of the semiconductor chip 3 oriented perpendicular to the radiation passage face 30, which defining faces connect the radiation passage face 30 to the side of the semiconductor chip 3 facing the connection support 2. An intermediate film 5, also denoted as intermediate foil, is applied over the connection side 20. The intermediate film 5 covers the electrical conductors 8 and the semiconductor chip 3. The entire radiation passage face 30 of the semiconductor chip 3 is likewise covered by the intermediate film 5. In this case, the intermediate film 5 is a silicone film. The semiconductor chip 3 in the form of a flip chip has a thickness in the direction perpendicular to the connection side 20 of approx. 150 μm. The thickness of the silicone film 5 amounts to approx. 50 μm.

A cavity 11 is formed at the chip flanks 6, enclosed by the intermediate film 5 and the connection side 20. According to FIG. 1, the cavity 11 has a comparatively small volume. The silicone film 5 lies partially against the chip flanks 6. A cast body 4 is applied to the side of the intermediate film 5 remote from the connection support 2. The cast body surrounds the semiconductor chip 3 substantially at the radiation passage face 30 thereof and at the chip flanks 6. The mechanical connection between the cast body 4 and the connection support 2 is produced by way of the intermediate film 5. In the regions in which the semiconductor chip 3 is located, the intermediate film 5 is connected indirectly to the connection support 2 via the semiconductor chip 3, i.e., the intermediate film 5 adheres to the semiconductor chip 3, which in turn adheres to the connection support 2.

The semiconductor chip 3 may take the form, for example, of a light-emitting diode. The materials of the cast body 4 and the intermediate film 5 should preferably be selected in such a way that the electromagnetic radiation emitted by the semiconductor chip 3 when the latter is in operation is not absorbed by the cast body 4. By lens-like shaping of the cast body 4, the light emitted by the semiconductor chip 3 is directed into a particular spatial area.

When the semiconductor chip 3 is in operation, it normally heats up significantly. Temperature differences between inoperative state and operating temperature of 50° C., or even 100° C. and more may occur. Mechanical stresses arise as a result of the different thermal expansions of semiconductor chip 3 and cast body 4. Starting from the edges of the semiconductor chip 3, thermal expansion brings with it the risk of cracking in the cast body 4. In addition to the improved adhesive bond between connection support 2 and cast body 4, the intermediate film 5, which may also be made from a silicone exhibiting a degree of flexibility when cured, reduces the mechanical stress due to thermal expansion. The intermediate film 5 acts as a type of buffer between semiconductor chip 3 and cast body 4.

A further cavity is formed by the connection support 2, the electrical conductors 8 and the semiconductor chip 3, which cavity is located between the connection support 2 and the semiconductor chip 3. The further cavity does not adjoin the intermediate film 5.

Optionally, the connection support 2 and also the electrical conductors 8 may be made from a material which is transmissive for the electromagnetic radiation to be emitted or received by the semiconductor chip 3. In this way, a semiconductor component, for example, emitting even on all sides may be produced. Alternatively, the electrical conductors 8 may, for example, be made from a metal such that the radiation emitted for instance by the semiconductor chip 3 in the direction of the connection support 2 is reflected by the electrical conductors 8 in the direction of the cast body 4.

FIG. 2 shows a further example. The structure resembles that of FIG. 1. The connection support 2 is made from a metal. To prevent short circuits, an electrical insulator 12 is applied at the appropriate points between conductor tracks 8 and connection support 2. The semiconductor chip 3 is applied to the electrical conductors 8 in such a way that the entire surface of the semiconductor chip 3 facing the connection support 2 is seated on the electrical conductor 8a. A second electrical conductor 8c is guided from the light passage face 30 to a further electrical conductor 8b. The electrical conductor 8c in the form of a bonding wire is guided through openings 10 in the intermediate film 5. The intermediate film 5 rests closely against the chip flanks 6 in this example, such that the cavity 11 has only a very small volume. The electrical conductors 8a, 8b are such that they may serve as reflectors for the radiation to be received or emitted by the semiconductor chip 3. The cast body 4 takes the form of a Fresnel lens. In this way, a particularly flat optoelectronic component 1 may be obtained.

Alternatively, the cast body 4 may also display other structuring such as for instance grooves which may, for example, bring about directed light radiation, improved light inlet or outlet, or uniform light radiation from the component 1.

In the example according to FIG. 3 the semiconductor chip 3 is adhesively bonded to a connection support 2, which may be made of metal, for example. The side of the semiconductor chip 3 facing the connection support 2 is preferably electrically insulating. The connection side 20 of the connection support 2 acts in reflective manner on the radiation to be received or emitted by the semiconductor chip 3. Alternatively, the semiconductor chip 3 may take the form of a "top emitter," i.e., the radiation to be emitted by the semiconductor chip 3 is produced close to the radiation passage face 30. When a top emitter is used, no reflective elements are needed, for instance, on the connection side 20.

The intermediate film 5 is applied over the entire surface of the connection support 2 and semiconductor chip 3. The cavity 11 is of relatively large volume. In this way, the intermediate film 5, which covers the complete radiation passage face 30 and leaves the chip flanks 6 free, becomes relatively flat towards the connection support 2. This makes it possible for the surface area of the intermediate film 5 remote from the connection support 2 not to be significantly greater than the projection of this surface area onto the connection support 2. This means in particular that electrical conductors 8 may be produced on the intermediate film 5 for instance using a photolithographic method or by means of vapor deposition. To contact the semiconductor chip 3, openings 10 are formed in the intermediate film 5 on a side of the semiconductor chip 3 remote from the connection support 2, which side also corresponds to the radiation passage face 30.

The openings 10 provide vias 9 from the contact pads (not shown) of the semiconductor chip 3 to the electrical conductors 8. The vias 9 may likewise be produced for instance using a photolithographic method. The electrical conductors 8, for example, of metal, only occupy a small proportion of the area of the intermediate film 5 and the radiation passage face 30. The cast body 4 provided with a planar surface therefore adheres substantially to the intermediate film 5 and via this to the connection support 2.

The intermediate support 5 may optionally contain an admixture 7. If the semiconductor chip 3 takes the form of a photodiode, for example, the spectral range which the semiconductor chip 3 is intended to detect may be restricted by way of the admixture 7. Possible admixtures 7 are in this case, for example, pigments or dyes. The intermediate film 5 may also comprise a plurality of different admixtures 7 such as conversion agents, luminescent substances, filter agents or diffusion agents.

Figure 4:
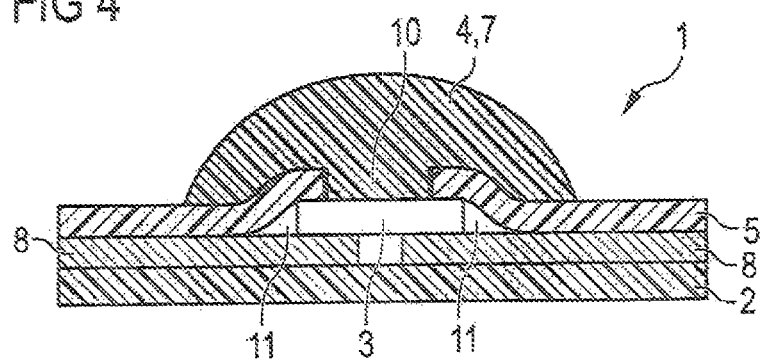
FIG. 4 is a schematic sectional representation of a further example.

In the example according to FIG. 4 the cast body 4 is provided with an admixture 7. The one or indeed the plurality of admixtures 7 may be as described, for example, in FIG. 3. Admixtures 7 which, for example, influence the mechanical or chemical characteristics of the cast body 4 are also possible. As in the example of FIG. 1, the semiconductor chip 3 takes the form of a flip chip. The electrical conductors 8 take up a large part of the side of the semiconductor chip 3 facing the connection support 2. The semiconductor chip 3 is connected to the electrical conductors 8 and thus to the connection support 2 by means of SMT soldering technology, i.e., by Surface Mount Technology.

In this example, the intermediate film 5 comprises an opening 10 in the region of the radiation passage face 30, such that the latter is substantially not covered by the intermediate film 5. With the exception of the opening 10 the intermediate film is applied over the entire connection support 2.

The intermediate film 5 may optionally be made of a material not transmissive to radiation such that, for example, the electrical conductors 8 are concealed. In this way, the conductors 8 are, in particular, not visible from the outside of the component 1.

The connection support 2 may take the form, for instance, of a printed circuit board with a mechanically flexible plastics substrate.

Figure 5:
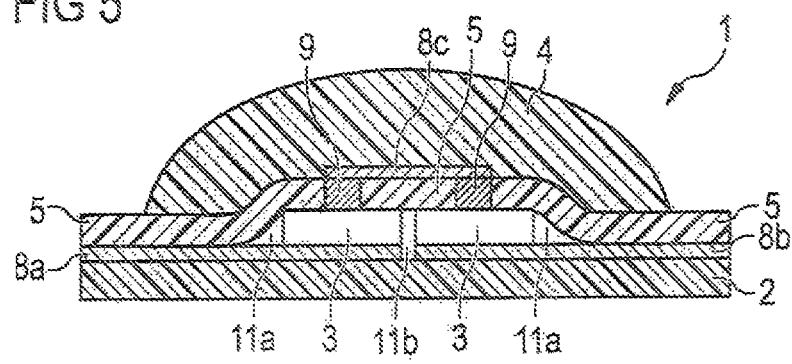
FIG. 5 is a schematic sectional representation of an example with a plurality of semiconductor chips.

FIG. 5 shows an example in which two semiconductor chips 3 are covered by a single cast body 4. The semiconductor chips 3, which may take the form, for example, of laser diodes are in each case applied over their entire area facing the connection support 2 on electrical conductors 8a, 8b. The electrical conductors 8a, 8b are made of metal and have a reflective action with regard to the electromagnetic radiation to be emitted or received by the semiconductor chips 3. The connection support 2 itself is made of a preferably thermally conductive ceramic material. The intermediate film 5 covers the two semiconductor chips 3 in such a way that a cavity 11b is formed between the mutually facing chip flanks 6

At the radiation passage faces 30 of the semiconductor chips 3 the intermediate film 5, which is transparent for the radiation to be emitted or received by the semiconductor chips 3, comprises openings 10. These openings 10 comprise vias 9, which connect the two chips together electrically by way of an electrical conductor 8b. This produces an electrical series connection. The vias 9 and the electrical conductor 8b may be produced by vapor deposition, for example. They take up only a small area of the radiation passage faces 30. The semiconductor chips 3 are covered by a cast body 4, which is of lens-like construction. In contrast to that shown in FIG. 5, the cast body 4 may also comprise sub-lenses for each individual semiconductor chip 3.

It is also possible for a plurality of semiconductor chips 3 to be arranged two-dimensionally, for example, in a 2×2 pattern. The four semiconductor chips 3 then provided may consist, for instance, of two green-emitting, one red- and one blue-emitting semiconductor chip 3 and overall produce for instance a white light source. Larger arrays of, for example, 3×3 or 4×4 semiconductor chips 3, which may also be irregularly arranged, are also possible. This is the case in particular if the connection support 2 is made from material with good thermal conductivity and, for instance, is additionally in contact with an external heat sink, not shown.

The semiconductor chips 3 may be connected in series, as shown in FIG. 5. Since the intermediate support 5 provides an insulating intermediate layer or covering layer on the semiconductor chips 3, it is particularly straightforwardly possible also to apply electrical conductors 8c over the radiation passage faces 30 of the semiconductor chips 3, which conductors are connected to the semiconductor chips 3 by way of vias 9. In this way, a highly densely packed chip array may be obtained.

As an alternative to the series connection shown in FIG. 5, it is also possible for the individual semiconductor chips 3, which emit in a certain color, to be connected in parallel or arranged in separate circuits, for instance to be able to control and vary the color emitted by the semiconductor chips 2 by the power supply to the semiconductor chips 3. The electrical conductors 8c may then extend substantially parallel to and over the electrical conductors 8a, 8b. The insulating intermediate film 5 thus makes it straightforwardly possible to produce a two-layer conductor arrangement situated on both sides of the intermediate film 5.

Figure 6:
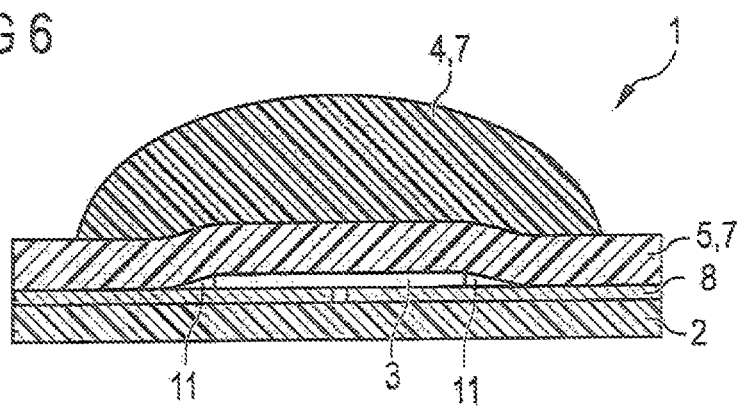
FIG. 6 is a schematic sectional representation of an example with a thin film chip.

According to the example in FIG. 6, a thin film chip 3 is used. This semiconductor chip 3 takes the form of a flip chip. It has a thickness of just 6 μm. The intermediate film 5, which is provided with an admixture 7, is thus markedly thicker than the semiconductor chip 3 itself. The use of very thin semiconductor chips 3 makes application of the intermediate film 5 by lamination easier, since compared with the thickness of the intermediate film 5 the structures on the connection side 20 are comparatively small. The cast body 4 in the form of a lens likewise contains an admixture 7.

FIGS. 7a to 7f are schematic representations of method steps for producing an optoelectronic component 1. The sequence of method steps shown in FIG. 7 should be regarded as advantageous, but may also be modified depending on requirements. This is true in particular of the step of applying the electrical conductors 8.

Figure 7A:
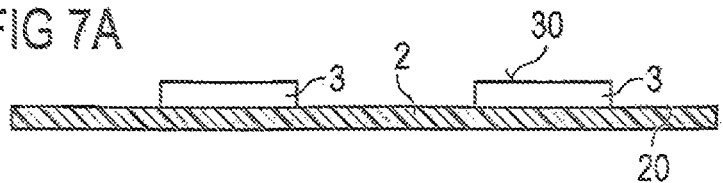
FIGS. 7a-f are schematic section representations of different method steps for producing an example.

In a first step according to FIG. 7a, a connection support 2 and a plurality of semiconductor chips 3 are provided. At variance with FIG. 7a more than two semiconductor chips 3 may be applied to the connection support 2, for instance, by adhesive bonding or soldering or epitaxial growth. The semiconductor chips 3 may also be arranged in a two-dimensional pattern.

Figure 7B:
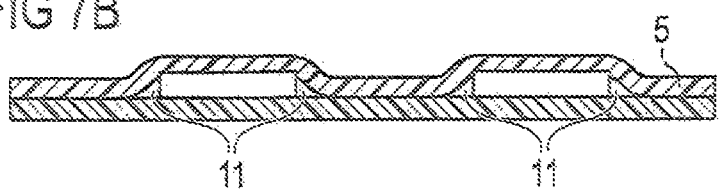

In a next step, see FIG. 7b, an intermediate support 5 is applied by lamination. The intermediate support 5 takes the form of a silicone film. Preferably, application of the intermediate support 5 is a two-stage process, i.e., in a first step a pre-crosslinked silicone film is applied, which has a soft or viscous consistency. In a second step, the pre-crosslinked intermediate film 5 is then cured, for example, by UV radiation or heat treatment. Through application of the pre-crosslinked intermediate film and the subsequent complete crosslinking, particularly good contact with the connection support 2 is ensured, such that the intermediate film 5 adheres well to the connection support 2.

Figure 7C:
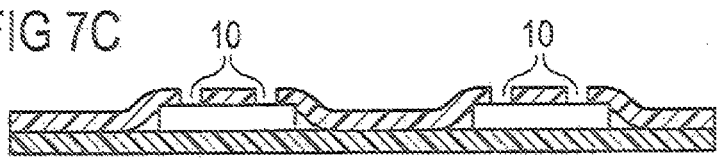

In a next step shown in FIG. 7c, openings 10 are provided in the intermediate film 5. This may be achieved, for example, by laser ablation. In this case, a pulsed laser, for example, which preferably has a wavelength which is absorbed by the intermediate film 10, is focused onto the intermediate film 5. The laser may for instance be a frequency tripled Nd:YAG laser producing ns pulses and emitting at 355 nm. The focus size of the laser may, for example, determine the structure sizes. It is likewise possible to produce structures in the intermediate film 5 by a scanning method. Alternatively, openings may also be produced, for example, using lithographic methods, also in combination with etching methods or indeed mechanically, for example, by milling.

Figure 7D:
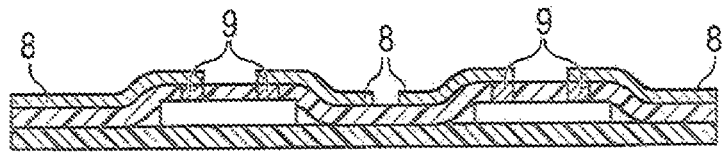

FIG. 7d shows that electrical conductors 8 and vias 9 are applied to the side of the intermediate film 5 remote from the connection support 2. Vias 9 and electrical conductors 8 take up only a very small proportion of the area of the intermediate support 5 remote from the connection support 2 and thus also of the radiation passage faces 30. Since the electrical conductors 8 may, for example, be applied by vapor deposition, more complex conductor patterns may be simply produced.

It is alternatively possible for contacting of the semiconductor chips to proceed via the connection side 20, as shown for instance in FIG. 1, or on opposing sides of the semiconductor chips 3 via bonding wires, as shown for instance in FIG. 2.

Figure 7E:
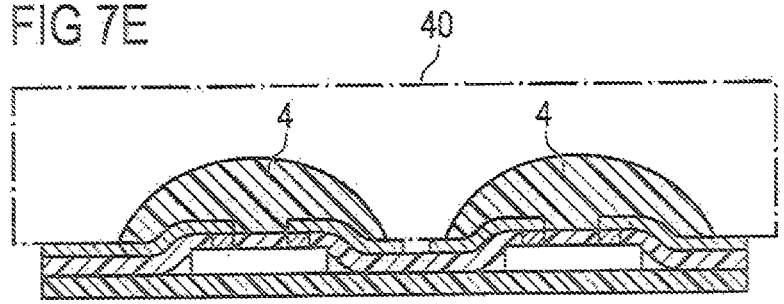

In a further step illustrated in FIG. 7e, a mold 40 is pressed onto the connection support 2. The connection support 2 forms part of the mold critical to casting. Depending on the configuration of the intermediate film 5, it is possible to dispense with a conventionally used sealing film, which is applied to the mold 40 since the intermediate film 5 may ensure a sufficient seal between mold 40 and connection support 2. Once the mold 40 has been applied, the cast body 4 is then cast. Adhesive bonding between cast body 4 and connection support 2 proceeds by way of the intermediate film 5.

Figure 7F:
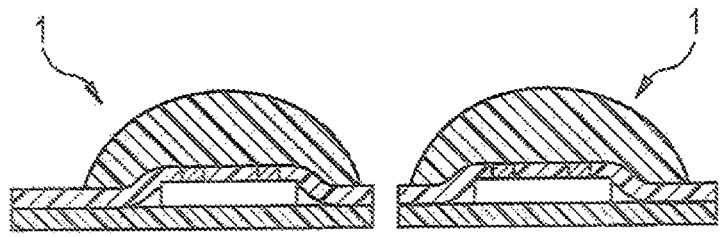

In a further step, see FIG. 7f, the semiconductor chips 3 with associated cast bodies 4 may be singulated, so resulting in a plurality of optoelectronic semiconductor components 1.

This singulation step may also be dispensed with, depending on requirements. It is then possible for differently emitting semiconductor chips 3 or different admixtures 7, especially conversion agents, to be applied to different regions of the connection support 2, such that, for instance, white light sources may be obtained, in accordance with the example of FIG. 5.

The structures and methods described herein are not restricted by the description given with reference to the examples. Rather, this disclosure encompasses any novel feature and any combination of features, including in particular any combination of features in the claims, even if this feature or this combination is not itself explicitly indicated in the claims or by example.

The invention claimed is:

1. An optoelectronic semiconductor component comprising:
   a connection support with a connection site and electrical conductors on the connection side,
   at least one optoelectronic semiconductor chip comprising chip flanks, mounted on the connection side and electrically connected to the connection support and comprising a radiation passage face remote from the connection side,
   an adhesion-promoting intermediate film comprising silicone, applied to the connection side and covering the latter at least in selected places, and
   at least one radiation-transmissive cast body comprising or consisting of a silicone which at least partially surrounds the semiconductor chip, the cast body being connected mechanically to the connection support by the intermediate film,
   wherein
   1) the intermediate film, the connection side and the chip flanks enclose a cavity and the intermediate film directly contacts the semiconductor chip and the connection side on a first side of the intermediate film, and with the cast body on a second side of the intermediate film,
   2) the intermediate film is made of a material not transmissive to radiation emitted by the optoelectronic semiconductor chip,
   3) the optoelectronic semiconductor chip is electrically connected by the electrical conductors located between the optoelectronic semiconductor chip and the connection support,
   4) the intermediate film partially covers the radiation passage face, and
   5) the intermediate film has a constant thickness.

2. The optoelectronic semiconductor component according to claim 1, wherein a radiation passage face of the semiconductor chip is covered at least in selected places by the intermediate film.

3. The optoelectronic semiconductor component according to claim 1, wherein the cast body and/or the intermediate film contain at least one admixture in the form of a diffuser, conversion and/or filter agent.

4. The optoelectronic semiconductor component according to claim 1, wherein the connection support comprises a metal or a metal alloy, a plastics material or a ceramic material.

5. The optoelectronic semiconductor component according to claim 1, wherein the intermediate film does not transmit radiation, and wherein the intermediate film comprises an opening at least in places at a radiation passage face.

6. The optoelectronic semiconductor component according to claim 1, having no housing apart from the connection support, the intermediate film and the cast body.

7. A method of producing an optoelectronic semiconductor component, comprising:
providing a connection support with a connection side,
providing at least one semiconductor chip,
mounting the semiconductor chip on the connection side and electrically connecting the semiconductor chip to the connection support,
applying an adhesion-promoting intermediate film comprising silicone to the connection side and covering the connection side at least in selected locations by applying a partially crosslinked intermediate film to the connection side and curing the intermediate film applied by lamination,
producing a cast body comprising or consisting of a silicone which at least partially surrounds the semiconductor chip, the cast body being mechanically connected to the connecting support by the intermediate film,
wherein 1) the adhesion-promoting intermediate film is in direct contact with the semiconductor chip and the connection side on a first side and with the cast body on a second side, and 2) at least one recess is provided in the intermediate film by laser ablation.

8. The method according to claim 7, wherein the intermediate film is applied over the entire surface of the connection side and of the semiconductor chip.

9. The method according to claim 7, wherein the cast body is produced by compression molding, and the connection support forms part of a mold.

10. The method according to claim 7, wherein volume shrinkage of the intermediate film caused by curing is less than 3%.

11. The method according to claim 7, wherein the intermediate film, the connection side and the chip flanks enclose a cavity.

12. A method of producing an optoelectronic semiconductor component, comprising:
providing a connection support with a connection side,
providing at least one semiconductor chip,
mounting the semiconductor chip on the connection side and electrically connecting the semiconductor chip to the connection support,
applying an adhesion-promoting intermediate film comprising silicone to the connection side and covering the connection side at least in selected locations by applying a partially crosslinked intermediate film to the connection side and curing the intermediate film applied by lamination, and
producing a cast body comprising or consisting of silicone which at least partially surrounds the semiconductor chip, the cast body being connected mechanically to the connection support by the intermediate film,
wherein 1) the adhesion-promoting intermediate film is in direct contact with the semiconductor chip and the connection side on a first site and with the cast body on a second side, 2) the intermediate film, the connection side and the chip flanks enclose a cavity, and 3) the intermediate film has a constant thickness.

13. The method of claim 12, wherein the intermediate film partially covers the radiation passage face.

* * * * *

UNITED STATES PATENT AND TRADEMARK OFFICE
CERTIFICATE OF CORRECTION

| | |
|---|---|
| PATENT NO. | : 8,563,998 B2 |
| APPLICATION NO. | : 12/934327 |
| DATED | : October 22, 2013 |
| INVENTOR(S) | : Wegleiter et al. |

It is certified that error appears in the above-identified patent and that said Letters Patent is hereby corrected as shown below:

In the Claims

<u>In Column 12</u>

At line 21, please change "site" to --side--.

Signed and Sealed this
Eleventh Day of February, 2014

Michelle K. Lee
*Deputy Director of the United States Patent and Trademark Office*